(12) United States Patent
Yang et al.

(10) Patent No.: US 7,683,717 B2
(45) Date of Patent: Mar. 23, 2010

(54) FULLY DIFFERENTIAL AMPLIFIER WITH CONTINUOUS-TIME OFFSET REDUCTION

(75) Inventors: Ta-wei Yang, Fremont, CA (US);
Jyn-Bang Shyu, Cupertino, CA (US);
Robert Olah, Sunnyvale, CA (US)

(73) Assignee: Intelleflex Corporation, San Jose, CA (US)

( * ) Notice: Subject to any disclaimer, the term of this patent is extended or adjusted under 35 U.S.C. 154(b) by 1100 days.

(21) Appl. No.: 11/303,897

(22) Filed: Dec. 15, 2005

(65) Prior Publication Data
US 2007/0139116 A1    Jun. 21, 2007

(51) Int. Cl.
*H03F 3/45* (2006.01)

(52) U.S. Cl. .............................. 330/259; 330/9; 330/258

(58) Field of Classification Search .................. 330/259, 330/9, 258
See application file for complete search history.

(56) References Cited

U.S. PATENT DOCUMENTS

| | | | |
|---|---|---|---|
| 4,213,098 A | 7/1980 | Tsividis | 330/253 |
| 4,371,843 A | 2/1983 | Fang et al. | 330/253 |
| 5,023,567 A | 6/1991 | O'Shaughnessy et al. | 330/253 |
| 5,218,320 A | 6/1993 | Albouy et al. | 330/259 |
| 5,381,114 A | 1/1995 | Pena-Finol et al. | 330/258 |
| 5,451,898 A | 9/1995 | Johnson | 327/563 |
| 5,455,539 A | 10/1995 | Mazoyer et al. | 330/258 |
| 5,568,089 A | 10/1996 | Maru | 330/253 |
| 5,729,178 A | 3/1998 | Park et al. | 330/258 |
| 5,955,922 A | 9/1999 | Nicollini et al. | 330/258 |
| 6,049,246 A | 4/2000 | Kozisek et al. | 330/9 |
| 6,140,872 A * | 10/2000 | McEldowney | 330/9 |
| 6,140,877 A | 10/2000 | Forbes | 330/258 |
| 6,229,443 B1 | 5/2001 | Roesner | 340/572.1 |
| 6,297,698 B1 | 10/2001 | Callahan, Jr. | 330/254 |
| 6,346,858 B1 | 2/2002 | Forbes | 330/258 |
| 6,362,682 B2 | 3/2002 | Shulman | 327/562 |
| 6,472,939 B2 | 10/2002 | Forbes | 330/253 |

(Continued)

FOREIGN PATENT DOCUMENTS

EP    0632581    6/1994

OTHER PUBLICATIONS

International Preliminary Examination Report from PCT Application No. PCT/US06/46339 mailed on Oct. 17, 2008.

(Continued)

*Primary Examiner*—Patricia Nguyen
(74) *Attorney, Agent, or Firm*—Zilka-Kotab, PC

(57) ABSTRACT

Fully differential amplifier circuits are described herein that set the common mode voltage as well as reduce the output offset voltage (offset cancellation). A circuit according to one embodiment includes a first section for generating first and second output signals on first and second outputs from first and second input signals, a first negative feedback loop coupled to the first section, and a second negative feedback loop coupled to the first section. A second section controls the first negative feedback loop for adjusting the first output signal towards a common mode voltage level, and for reducing an offset voltage of the first output signal in different loop bandwidths. A third section controls the second negative feedback loop for adjusting the second output signal towards the common mode voltage level, and for reducing an offset voltage of the second output signal in different loop bandwidths.

24 Claims, 8 Drawing Sheets

U.S. PATENT DOCUMENTS

| | | | |
|---|---|---|---|
| 6,525,608 B2 | 2/2003 | Krupnik | 330/253 |
| 6,552,611 B2 | 4/2003 | Yamamoto | 330/253 |
| 6,628,168 B2 | 9/2003 | Martin et al. | 330/253 |
| 6,657,485 B2 | 12/2003 | Kimura | 327/563 |
| 6,747,515 B2 | 6/2004 | Callahan, Jr. | 330/254 |
| 6,753,730 B2 | 6/2004 | Yamamoto | 330/253 |
| 6,850,109 B2 | 2/2005 | Kimura | 327/361 |
| 7,385,442 B1 * | 6/2008 | Ripley | 330/9 |
| 7,495,511 B2 * | 2/2009 | Gilbert et al. | 330/254 |
| 2001/0026192 A1 | 10/2001 | Yamamoto | 330/253 |
| 2002/0008581 A1 | 1/2002 | Callahan, Jr. | 330/254 |
| 2002/0053949 A1 | 5/2002 | Forbes | 330/253 |
| 2002/0089377 A1 | 7/2002 | Hwang | 330/252 |
| 2002/0171486 A1 | 11/2002 | Krupnik | 330/253 |
| 2003/0006841 A1 | 1/2003 | Martin et al. | 330/253 |
| 2003/0206061 A1 | 11/2003 | Yamamoto | 330/253 |
| 2008/0204138 A1 | 8/2008 | Yang et al. | 330/258 |

OTHER PUBLICATIONS

Allen, Phillip E. et al., "CMOS Analog Circuit Design" Oxford University Press, New York, 2002.

International Search Report and Written Opinion from PCT Application No. PCT/US06/46339 mailed on Sep. 28, 2007.

International Preliminary Report from PCT Application No. PCT/US06/46339 mailed on Jun. 26, 2008.

Office Action Summary from U.S. Appl. No. 11/677,909 which was mailed on Apr. 7, 2009.

Written Opinion and International Search Report from PCT Application No. PCT/US07/26204 mailed on Sep. 22, 2008.

Office Action Summary from U.S. Appl. No. 11/677,909 mailed on Aug. 5, 2009.

* cited by examiner

FULLY DIFFERENTIAL AMPLIFIER WITH CONTINUOUS-TIME OFFSET REDUCTION

FIELD OF THE INVENTION

The present invention relates to fully differential amplifiers, and more particularly, this invention relates to a fully differential amplifier which performs continuous-time common mode output voltage correction and output offset voltage reduction.

BACKGROUND OF THE INVENTION

Differential amplifiers are commonly employed in electronic devices that use analog circuits. In addition to a variety of discrete circuit applications, differential amplifiers are also used in many integrated devices such as, for example, operational amplifiers, which are a fundamental building block in many analog circuits and devices. The growing demand for mobile or portable electronic equipment or devices has increased the need to produce simple, lightweight, energy-efficient electronic equipment, which has resulted in an increased demand for low-power operational amplifiers.

Generally speaking, to reduce the power consumption of an operational amplifier, the operational amplifier must be operated at relatively low supply voltages. Unfortunately, as the supply voltage is reduced, the useful dynamic input range and output range of the operational amplifier is reduced. In general, the operating range of the input terminals of an operational amplifier depends on the input stage configuration of the operational amplifier. As is well known, the operating range or dynamic range of the input terminals of a differential amplifier is commonly referred to as a common-mode input range (CMR). In the case of an operational amplifier buffer circuit such as, for example, a voltage follower, the CMR of the operational amplifier determines the dynamic range of the buffer inputs. A differential amplifier that provides a CMR substantially equal to the voltage drop across the supply terminals of the differential amplifier is commonly referred to as a rail-to-rail CMR differential amplifier.

FIG. 1 shows a fully differential input stage 100 which is commonly used in an operational amplifier. NMOS devices MN1 and MN2 are ideally identical, as are the PMOS devices MP1 and MP2. When input signals IN and IP are at the same DC voltage, output signals ON and OP should have the same DC level which is a known common mode level. In reality, however, because of process variations, the DC potentials of the output signals ON and OP are not the same and not well-defined. Particularly, because the PMOS and NMOS devices have inherent differences due to the fabrication process, DC outputs cannot be well-defined in the circuit 100 of FIG. 1, even when the input signals IN and IP are at the same DC value. That is, the output signals OP and ON both could drift in the same direction to the stronger PMOS or NMOS device. This drift could degrade the gain of amplifier because the stronger devices tend to go into the unwanted bias region such as the low resistance triode region.

Common Mode Feed Back (CMFB) circuits are used to create a well-defined DC common mode output level. A typical CMFB circuit 200 is shown in FIG. 2. By sensing the DC output voltage of the output signals OP and ON and by comparing the output signals OP and ON with the desired output DC voltage level Vcm, the output signals OP and ON are adjusted to be the same as Vcm via the feedback loop. However, present CMFB circuits can only correct the common mode output voltage level. They cannot correct the output offset voltage.

Furthermore, because of process variations, NMOS devices MN1 and MN2 become un-identical, as do the current mirror MP1 and MP2. Mismatches between these same-type devices create unequal outputs. When input signals IP and IN are at the same DC value, output signals OP and ON are different. When the input signals IP and IN are equal, the DC voltage difference between the output signals OP and ON is known as the output offset voltage.

What is therefore needed is a CMFB circuit that also provides output offset reduction/cancellation.

SUMMARY OF THE INVENTION

Fully differential amplifier circuits are described herein that set the common mode voltage as well as reduce the output offset voltage (offset cancellation) in continuous time. A circuit according to one embodiment includes a first section for generating first and second output signals on first and second outputs from first and second input signals, a first feedback loop coupled to the first section, and a second feedback loop coupled to the first section. A second section controls the first feedback loop for adjusting the first output signal towards a common mode voltage level, and for reducing an offset voltage of the first output signal. A third section controls the second feedback loop for adjusting the second output signal towards the common mode voltage level, and for reducing an offset voltage of the second output signal.

The first, second and third sections may be differential cells. In one embodiment, the first section includes a first transistor being controlled by the first input signal and a second transistor being controlled by the third section via the second feedback loop; wherein the first section further includes a third transistor being controlled by the second input signal and a fourth transistor being controlled by the second section via the first feedback loop. Preferably, the transistors operate in their subthreshold regions.

A low pass filter is coupled to the first and second feedback loops, wherein differential components of signals passing through the first and second feedback loops reduce or cancel the offset voltages of the first and second output signals. The second and third section are preferably coupled together via a capacitor to create a low pass filter with two bandwidths. For differential signals, the capacitor doubles its low pass effect. For the common mode component of signals, the capacitor is ineffective. The low pass filter preferably filters out substantially all differential components of signals from the feedback loops having about the same frequency as the desirable data portions of the input signals for offset reduction.

A fully differential amplifier circuit according to another embodiment includes a first section for generating first and second output signals on first and second outputs from first and second input signals. A first feedback loop couples the first output to a low pass filter with two bandwidths, the first feedback loop adjusting the first output towards a common mode voltage level with one bandwidth, and reducing an offset voltage of the first output signal with the other bandwidth. A second feedback loop couples the second output to a low pass filter with two bandwidths, the second feedback loop controlling the second feedback loop for adjusting the second output towards the common mode voltage level with one bandwidth, and reducing an offset voltage of the second output signal with the other bandwidth.

A method for setting a common mode voltage and cancelling an offset voltage of an amplified signal according to one embodiment of the present invention includes generating first and second output signals from first and second input signals; comparing the first and second output signals to a common mode voltage level for generating first and second feedback signals; the feedback signals simultaneously adjusting the first and second output signals towards the common mode voltage level and reducing an offset voltage of the first and second output signals.

An RFID system includes a plurality of RFID tags having one or more of the circuits described above or performing a method described above, and an RFID interrogator in communication with the RFID tags.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

The following specification describes a differential amplifier that uses feedback loops to individually control the differential outputs for providing offset cancellation while setting a common mode output.

Many types of devices can take advantage of the embodiments disclosed herein, including but not limited to Radio Frequency Identification (RFID) systems and other wireless devices/systems; pacemakers; portable electronic devices; audio devices and other electronic devices; smoke detectors; etc. To provide a context, and to aid in understanding the embodiments of the invention, much of the present description shall be presented in terms of an RFID system such as that shown in FIG. 3. It should be kept in mind that this is done by way of example only, and the invention is not to be limited to RFID systems, as one skilled in the art will appreciate how to implement the teachings herein into electronics devices in hardware and/or software. Examples of hardware include Application Specific Integrated Circuits (ASICs), printed circuits, monolithic circuits, reconfigurable hardware such as Field Programmable Gate Arrays (FPGAs), etc. Further, the methodology disclosed herein can also be incorporated into a computer program product, such as a computer disc containing software. Further, such software can be downloadable or otherwise transferable from one computing device to another via network, nonvolatile memory device, etc.

Figure 1:
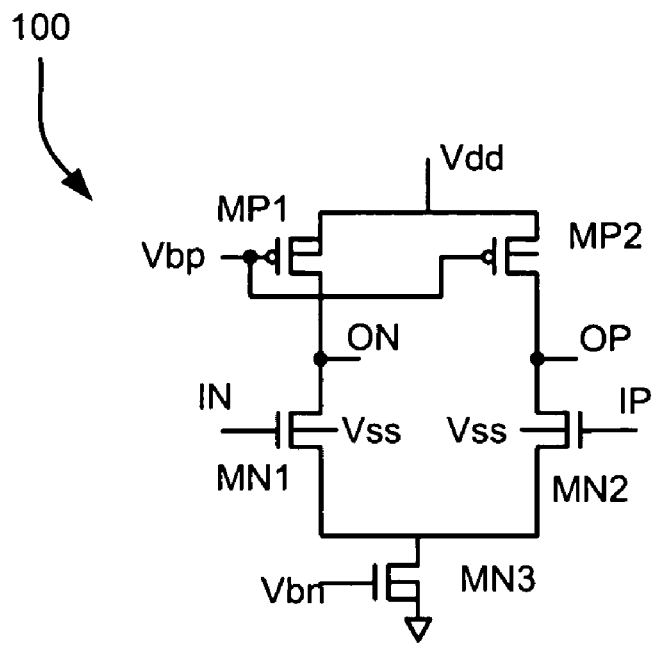
FIG. 1 is a circuit diagram of an input stage of an operational amplifier.
Figure 2:
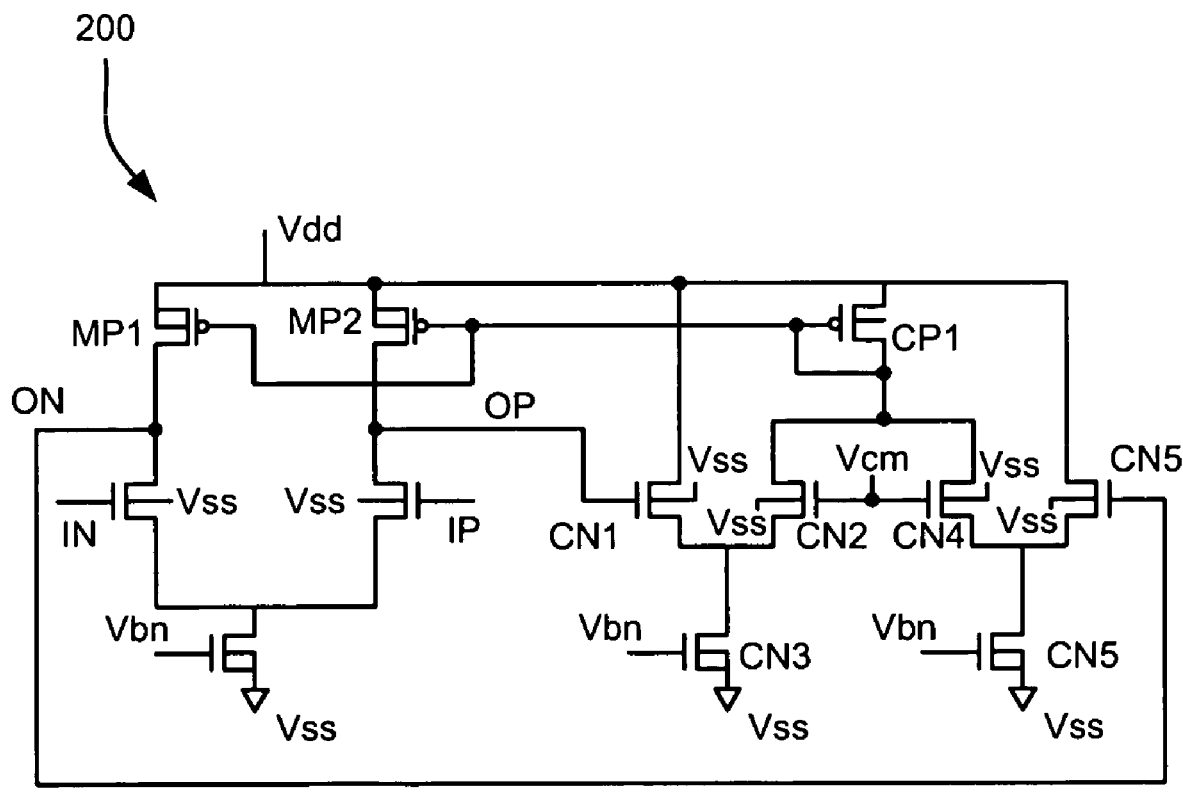
FIG. 2 is a circuit diagram of common mode feedback circuit.
Figure 3:
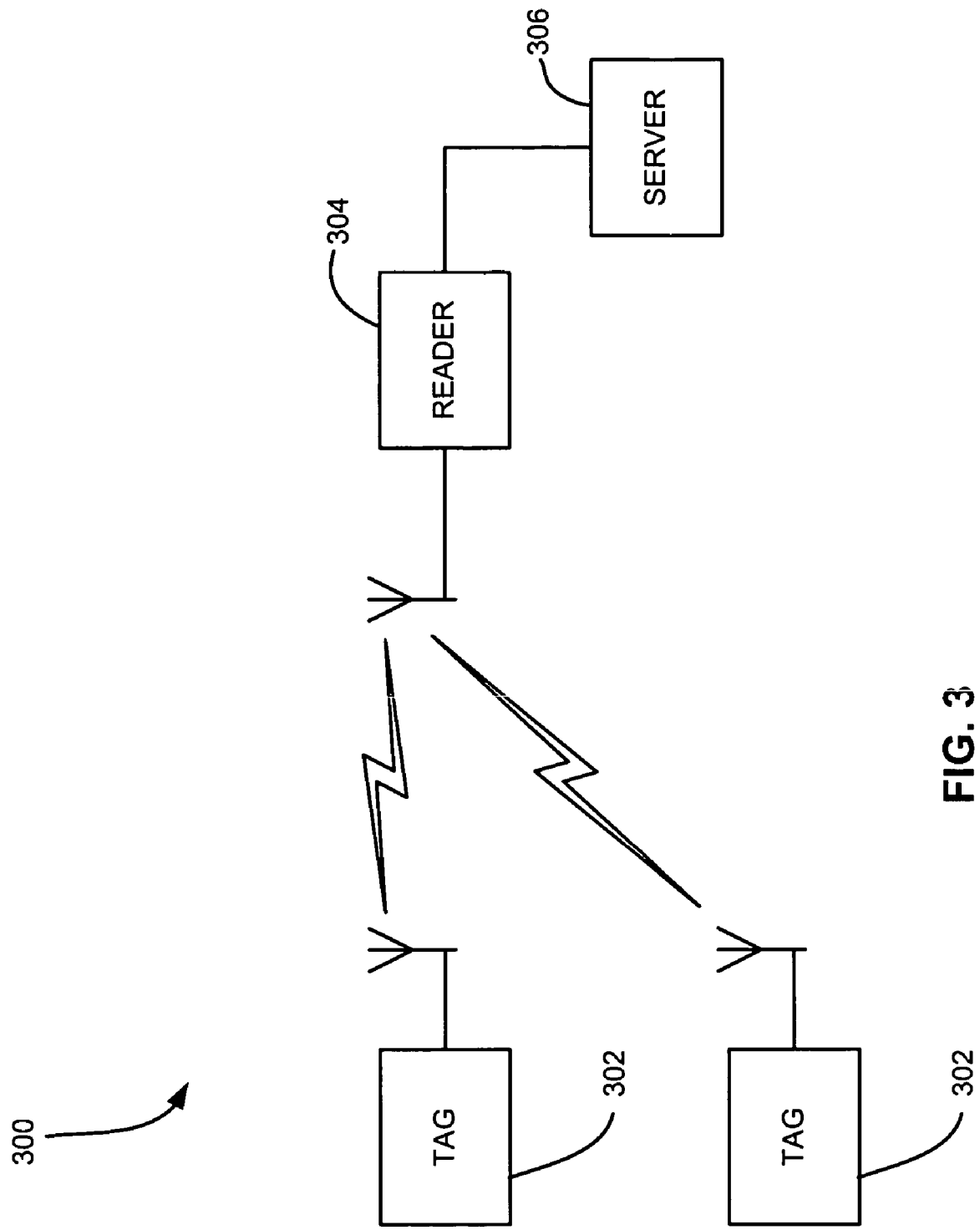
FIG. 3 is a system diagram of an RFID system.

As shown in FIG. 3, an RFID system 300 includes a tag 302, a reader 304, and an optional server 306. The tag 302 includes an IC chip and an antenna. The IC chip includes a digital decoder needed to execute the computer commands that the tag 302 receives from the tag reader 304. The IC chip also includes a power supply circuit to extract and regulate power from the RF reader; a detector to decode signals from the reader; a backscatter modulator, a transmitter to send data back to the reader; anti-collision protocol circuits; and at least enough memory to store its EPC code.

Communication begins with a reader 304 sending out signals to find the tag 302. When the radio wave hits the tag 302 and the tag 302 recognizes and responds to the reader's signal, the reader 304 decodes the data programmed into the tag 302. The information is then passed to a server 306 for processing, storage, and/or propagation to another computing device. By tagging a variety of items, information about the nature and location of goods can be known instantly and automatically.

Many RFID systems use reflected or "backscattered" radio frequency (RF) waves to transmit information from the tag 302 to the reader 304. Since passive (Class-1 and Class-2) tags get all of their power from the reader signal, the tags are only powered when in the beam of the reader 304.

The Auto ID Center EPC-Compliant tag classes are set forth below:

Class-1
Identity tags (RF user programmable, maximum range 3 m)
Lowest cost
Class-2
Memory tags (8 bits to 128 Mbits programmable at maximum 3 m range)
Security & privacy protection
Low cost
Class-3
Semi-Active tags
Battery tags (256 bits to 64 Kb)
Self-Powered Backscatter (internal clock, sensor interface support)
100 meter range
Moderate cost
Class-4
Active tags
Active transmission (permits tag-speaks-first operating modes)
Up to 30,000 meter range
Higher cost In RFID systems where passive receivers (i.e., Class-1 and Class-2 tags) are able to capture enough energy from the transmitted RF to power the device, no batteries are necessary. In systems where distance prevents powering a device in this manner, an alternative power source must be used. For these "alternate" systems (also known as semi-passive), batteries are the most common form of power. This greatly increases read range, and the reliability of tag reads, because the tag doesn't need power from the reader. Class-3 tags only need a 10 mV signal from the reader in comparison to the 500 mV that a Class-1 tag needs to operate. This 2,500:1 reduction in power requirement permits Class-3 tags to operate out to a distance of 100 meters or more compared with a Class-1 range of only about 3 meters.

Figure 4:
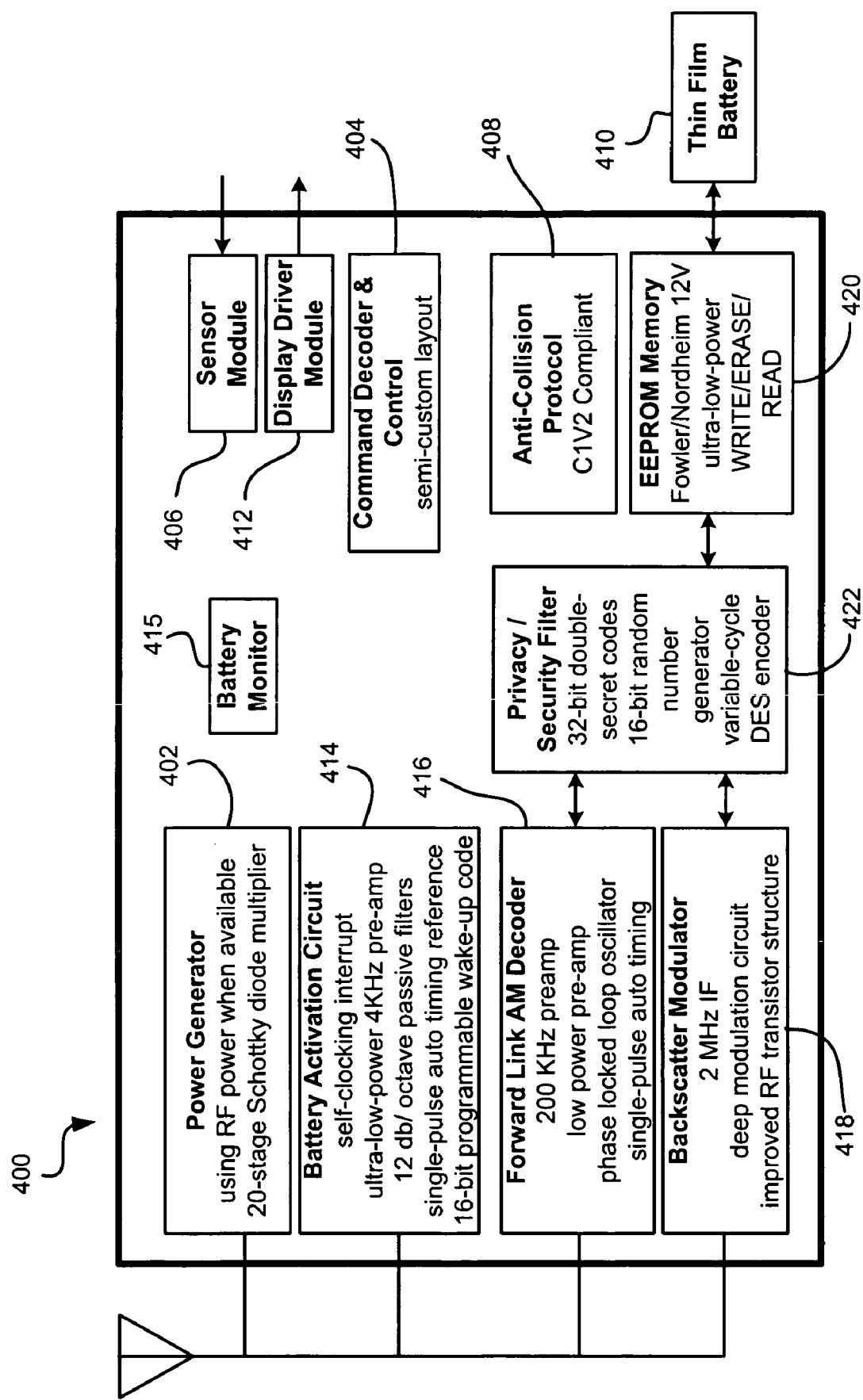
FIG. 4 is a system diagram for an integrated circuit (IC) chip for implementation in an RFID tag.

Embodiments of the present invention are implemented in a Class-3 or higher Class chip. FIG. 4 depicts a circuit layout of a Class-3 chip 400 according to an illustrative embodiment for implementation in an RFID tag. This Class-3 chip can form the core of RFID chips appropriate for many applications such as identification of pallets, cartons, containers, vehicles, or anything where a range of more than 2-3 meters is desired. As shown, the chip 400 includes several industry-standard circuits including a power generation and regulation circuit 402, a digital command decoder and control circuit 404, a sensor interface module 406, a C1V2 interface protocol circuit 408, and a power source (battery) 410. A display driver module 412 can be added to drive a display.

A battery activation circuit 414 is also present to act as a wake-up trigger. In brief, the battery activation circuit 414 may include an ultra-low-power, narrow-bandwidth preamplifier with an ultra low power static current drain. The battery activation circuit 414 may also include a self-clocking interrupt circuit and uses an innovative user-programmable digital wake-up code. The battery activation circuit 414 draws less power during its sleeping state and is much better protected against both accidental and malicious false wake-up trigger events that otherwise would lead to pre-mature exhaustion of the Class-3 tag battery 410.

A battery monitor 415 can be provided to monitor power usage in the device. The information collected can then be used to estimate a useful remaining life of the battery.

A forward link AM decoder 416 uses a simplified phase-lock-loop oscillator that requires an absolute minimum amount of chip area. Preferably, the circuit 416 requires only a minimum string of reference pulses.

A backscatter modulator block 418 preferably increases the backscatter modulation depth to more than 50%.

A memory cell, e.g., EEPROM is also present. In one embodiment, a pure, Fowler-Nordheim direct-tunneling-through-oxide mechanism 420 is present to reduce both the WRITE and ERASE currents to less than 0.1 µA/cell in the EEPROM memory array. Unlike any RFID tags built to date, this will permit designing of tags to operate at maximum range even when WRITE and ERASE operations are being performed.

The module 400 may also incorporates a highly-simplified, yet very effective, security encryption circuit 422. Other security schemes, secret handshakes with readers, etc. can be used.

Only four connection pads (not shown) are required for the chip 400 to function: Vdd to the battery, ground, plus two antenna leads to support multi-element omni-directional antennas. Sensors to monitor temperature, shock, tampering, etc. can be added by appending an industry-standard I2C interface to the core chip.

It should be kept in mind that the present invention can be implemented in any type of device, and the chip 400 described above is presented as only one possible implementation.

Figure 5:
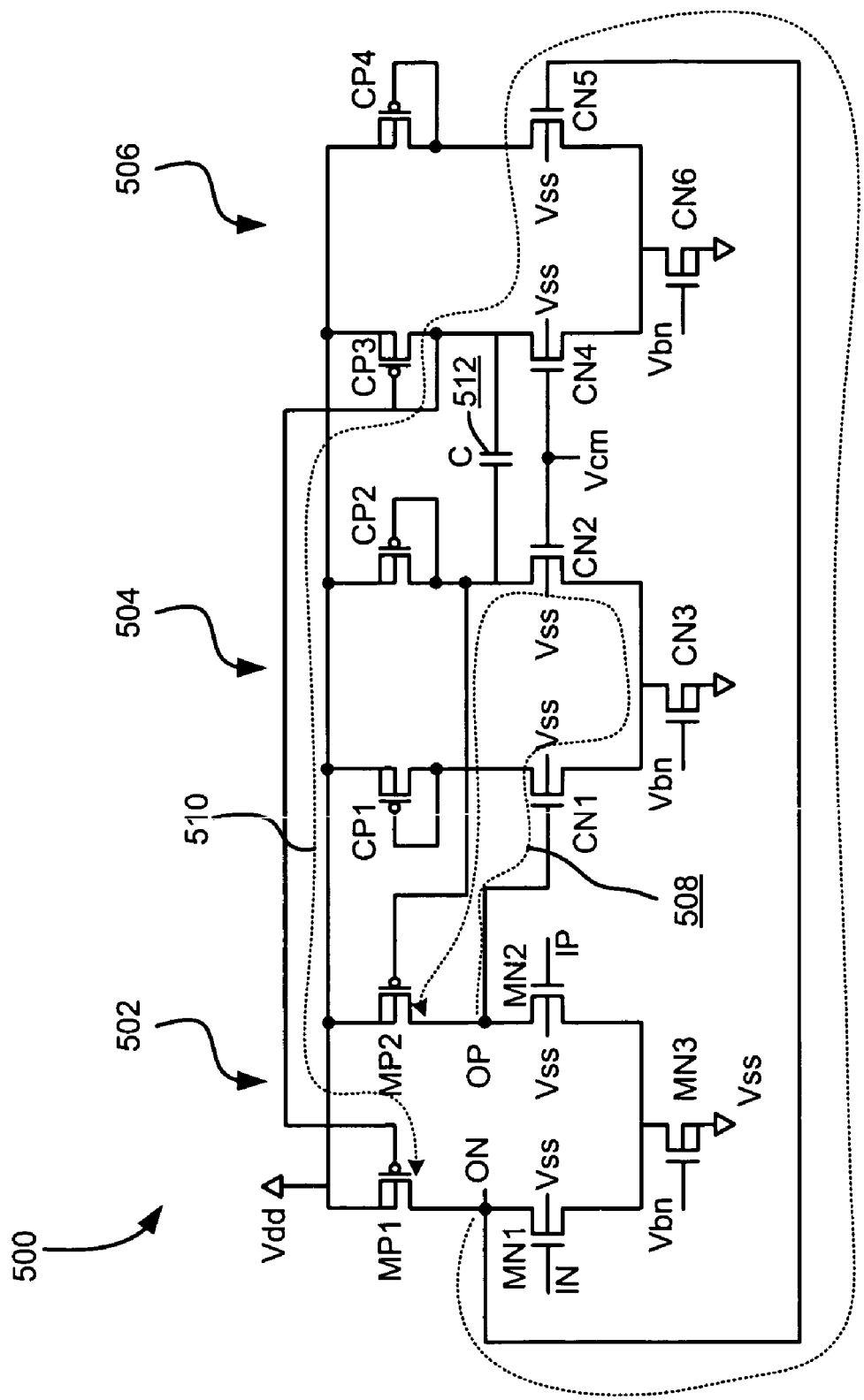
FIG. 5 is a circuit diagram of a fully differential amplifier circuit according to one embodiment of the present invention.

In RF systems such as RFID systems, output signals received from the AM detector can be very weak, e.g., a few hundred microvolts. In order to utilize such a weak signal, it is usually necessary to amplify it. FIG. 5 depicts a circuit 500 that combines the ability to set a DC common mode output voltage with DC output offset cancellation. This circuit 500 can function as a fully differential amplifier. As shown, the circuit 500 includes first, second and third sections 502, 504, 506. Each of these sections is preferably a differential cell, as described below. An amplifier implementing the fully differential amplifier circuit 500 may include multiple stages, each stage being substantially like the circuit 500 shown.

The first section 502 is the main amplification section, which amplifies input signals IN, IP. In an RFID application, input signals IN, IP from an AM detector are passed to the first section 502. In other applications, input signals IN, IP can be from another signal source. Differential output signals ON, OP are generated from the input signals IN, IP. The first section 502 shown includes a pair of transistors MN1, MN2 which are controlled by the input signals IN, IP. The first section 502 also includes a pair of transistors MP1, MP2 which are controlled by negative feedback loops 508, 510, respectively, the general paths of which are shown in dashed lines. How the negative feedback loops 508, 510 function in conjunction with the various sections of the circuit 500 is presented in more detail below. Each differential output ON, OP is monitored separately.

The second section 504 in this exemplary embodiment includes transistors CP1, CP2, CN1, CN2, and CN3. The third section 506 in this exemplary embodiment includes transistors CP3, CP4, CN4, CN5, and CN6. The second and third sections 504, 506 compensate for the offset voltage and also set the common mode output via the negative feedback loops 508, 510.

Each feedback loop can individually adjust output DC voltages OP and ON, toward a common mode reference voltage Vcm. By sensing the DC output voltage of the output signals OP and ON and by comparing the output signals OP and ON with the desired output DC voltage level Vcm, the output signals OP and ON are adjusted to be at the same level as Vcm via the respective feedback loop.

In operation, for example, to set output signal OP to the common mode voltage level, the output OP is compared with Vcm in the second section 504 of the circuit 500 via transistors CN1 and CN2. If the output OP is higher than Vcm, the first feedback loop 508 weakens transistor MP2 and draws down the output signal OP. The third section 506 functions similarly with the second feedback loop 510 to set output signal ON to the common mode voltage level.

The negative feedback scheme not only sets a DC common mode voltage but also adjusts any DC difference between OP and ON toward Vcm. This DC difference between OP and ON is the output offset voltage, when IN and IP have the same DC voltage. The offset voltage is caused by MN1 and MN2 or MP1 and MP2 devices in the circuit 502 not being perfectly matched due to manufacturing variations, etc.

Figure 6:
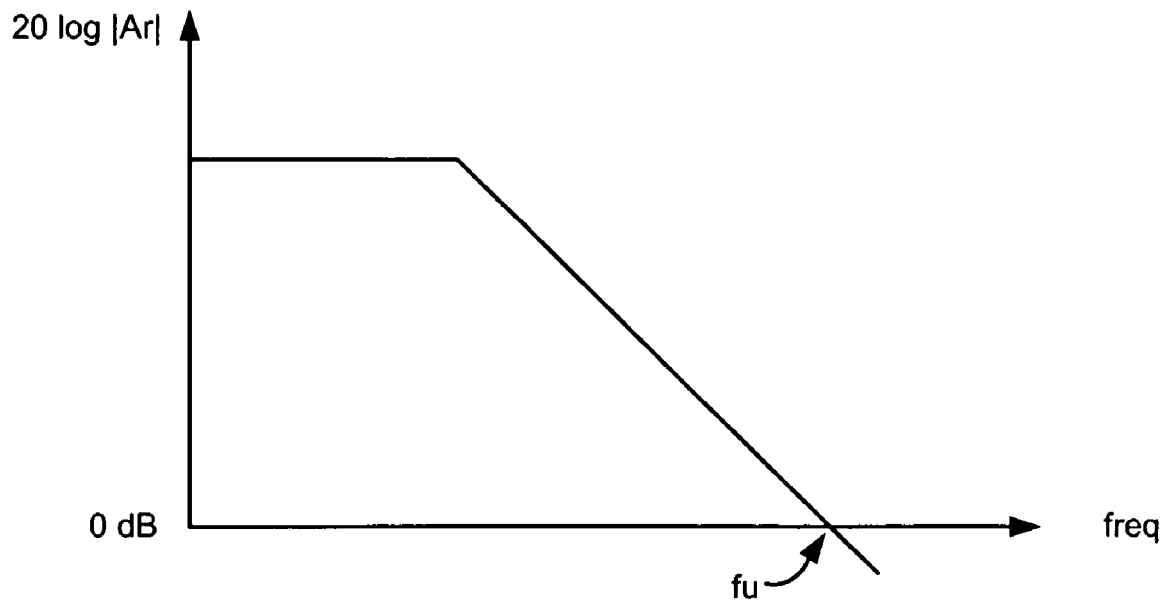
FIG. 6 is a graph of an amplifier frequency response.

Because offset voltage and common mode voltage are DC values, a capacitor (C) 512 is added. Combining the capacitor and an amplifier, e.g., second and/or third sections, a low pass filter is created by taking advantage of amplifier's gain rolling-off frequency response, shown in FIG. 6, where Av is the absolute value. This low pass filter limits both the common mode and differential mode feedback loop bandwidth by its unit gain bandwidth-fu; meanwhile, it maintains feedback loop gain at a lower frequency for correction. The differential mode feedback loop bandwidth is smaller than the frequencies of input signals IN, IP, but the common mode loop bandwidth can be larger than the frequencies of input signals IN, IP. In this way, the offset and DC output information can pass through each loop; common mode voltage is set and offset voltage correction are achieved by the two individual negative feedback loops 508, 510.

Figure 7:
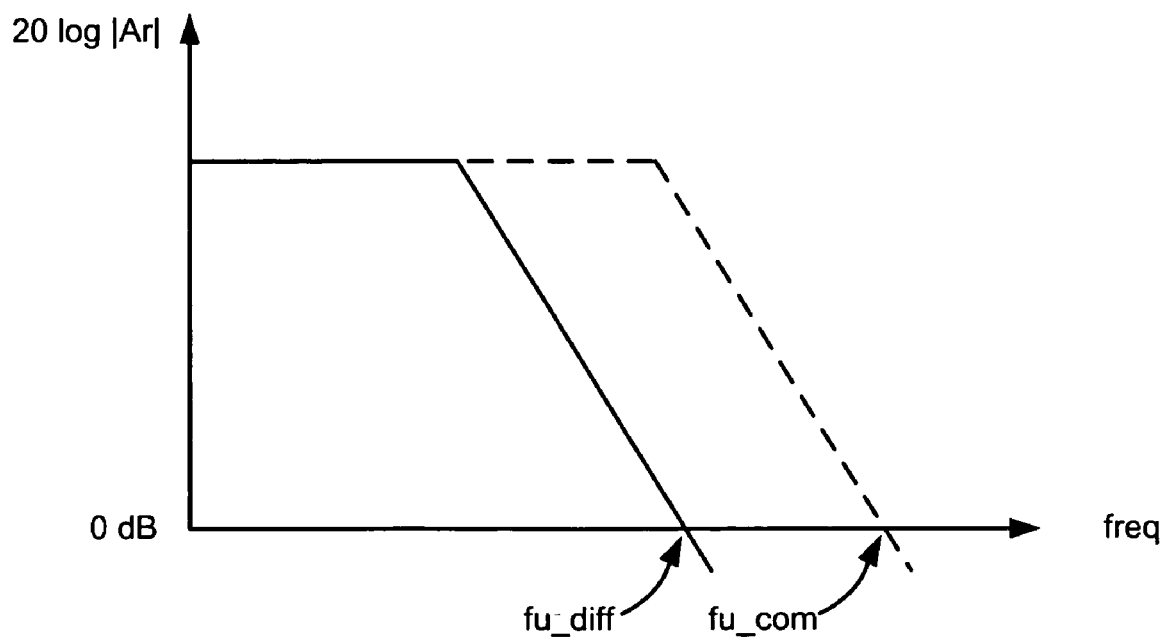
FIG. 7 is a graph of frequency responses for differential and common mode feedback loops.

The filtering operates on the premise that in common mode, if one signal goes high, the other signal goes high, then the coupled capacitor is ineffective. In differential mode, the opposite is true; when one signal goes high, the other signal goes low, and the capacitor effectively doubles its capacitance. Thus, because of the nature of the common mode, the common mode feedback signal is not affected by the capacitor. On the other hand, when current flows into the capacitor, the differential signal feedback (low bandwidth) is affected. So, the differential feedback loop unit-gain bandwidth fu_diff is smaller than common mode feedback loop's fu_cm, as shown is FIG. 7.

Again, the purpose of the circuit is to amplify the incoming signals IN, IP, so the filtering is carefully selected to cancel only the DC signal offset while allowing high frequency signals, e.g., 2 kHz and 8 kHz to be amplified and output, while low frequencies, e.g., below 1 kHz, are fed back to provide the offset cancellation. High frequencies can broadly be defined as frequencies in about the vicinity of the data portion frequency of the incoming signals IN, IP, e.g., 2 kHz and 8 kHz, while low frequencies are somewhere below the data frequency range. In other words, because it is undesirable to cancel the desired part of the signal (high frequency), the low pass filter is implemented to only allow the low frequency part of the differential feedback signal to pass. Thus the feedback has no cancelling effect on the high frequency (desired) signal. The common mode feedback loop has a wider bandwidth and responds faster.

Accordingly, the same two negative feedback loops 508, 510 provide both an offset cancellation signal for cancelling the offset voltage, as well as a common mode adjustment signal.

To conserve power, as well as operate with very low input signal strength, the transistors in any of the sections 502, 504, 506 can operate in the subthreshold range. The transistors in the circuit can also run at strong inversion. Transistors operated in high impedance regions are preferred to keep power consumption low. For instance, the low pass filter frequency is preferably lower than 1 kHz, so it may not be practically applicable to use a purely RC circuit for monolithic application. Because resistance value is more than several Mega ohms, such a large value resistor would need a huge area on the wafer and would create huge and unpredictable parasitic capacitance. In contrast, in preferred embodiments of the present invention, each low pass feedback loop may take advantage of MOS transistor sub-threshold characteristics: low current and high impedance to achieve low pass filer, low power consumption, and save silicon die area.

In another preferred embodiment, offset cancellation works by controlling a portion of the differential pair current to adjust the DC offset, as above. It also implements a low pass filter by using the nature of amplifier characteristic-gain falling-off at its first pole. See FIG. 6. This first pole takes advantage of the high impedance of the subthreshold region of MOS transistors with a reasonable sized of capacitor, e.g., ~18 pf in the common-mode feedback differential pair at each stage of the preamp.

Figure 8:
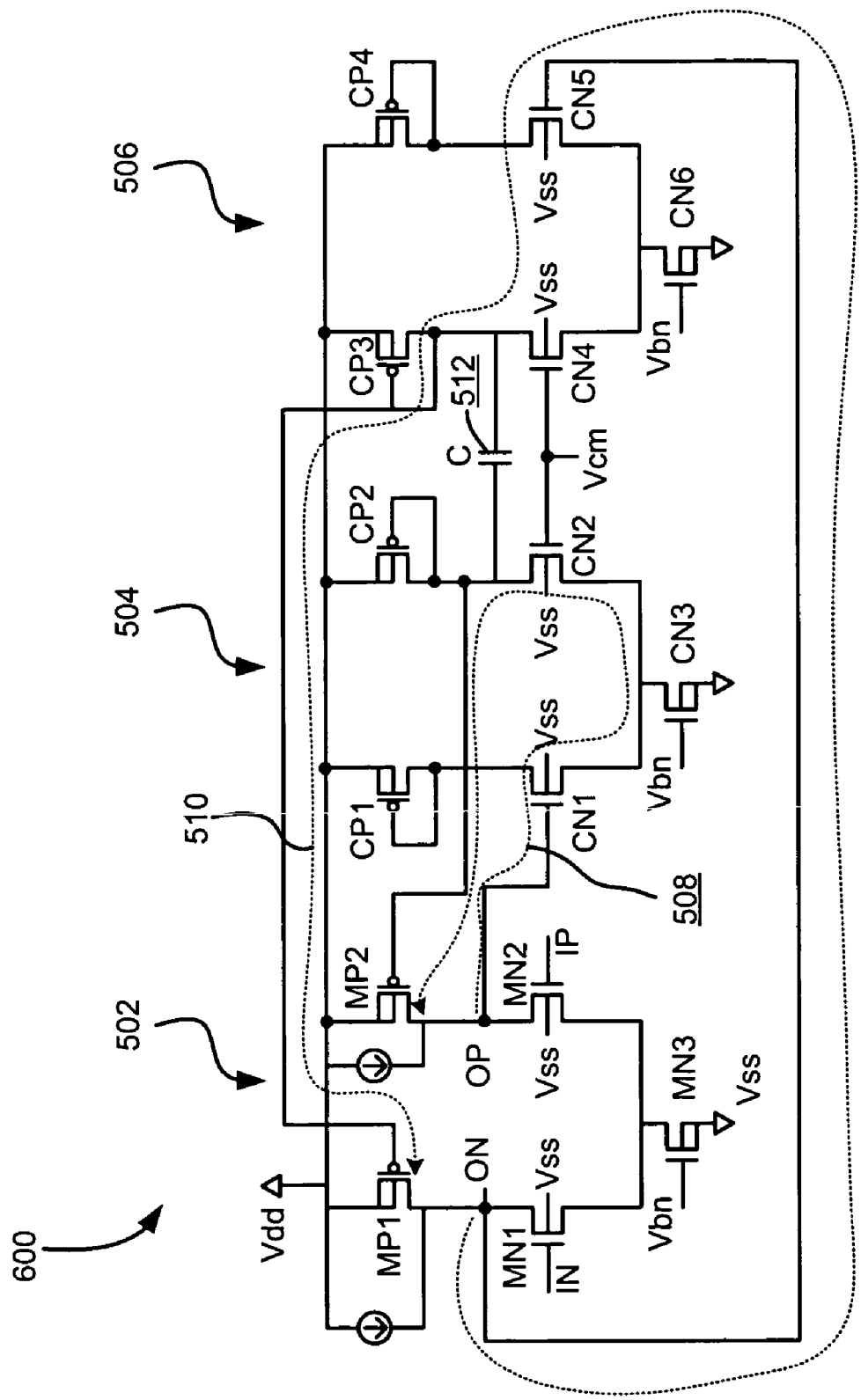
FIG. 8 is a circuit diagram of a fully differential amplifier circuit according to one embodiment of the present invention.

FIG. 8 illustrates an alternate embodiment 600. The inventors have found that the more the current is controlled by the common-mode feedback loop, the more efficient the feedback loop is at correcting the offset voltage. According to calculations performed by the inventors, the ratio of current controlled by the common mode feedback loop to total amount of current vs. offset voltage amplification corresponds to the following for the first stage; ratio=½, offset voltage gain=1; ratio=¼, gain=2; ratio=⅐, gain=4.

Figure 9:
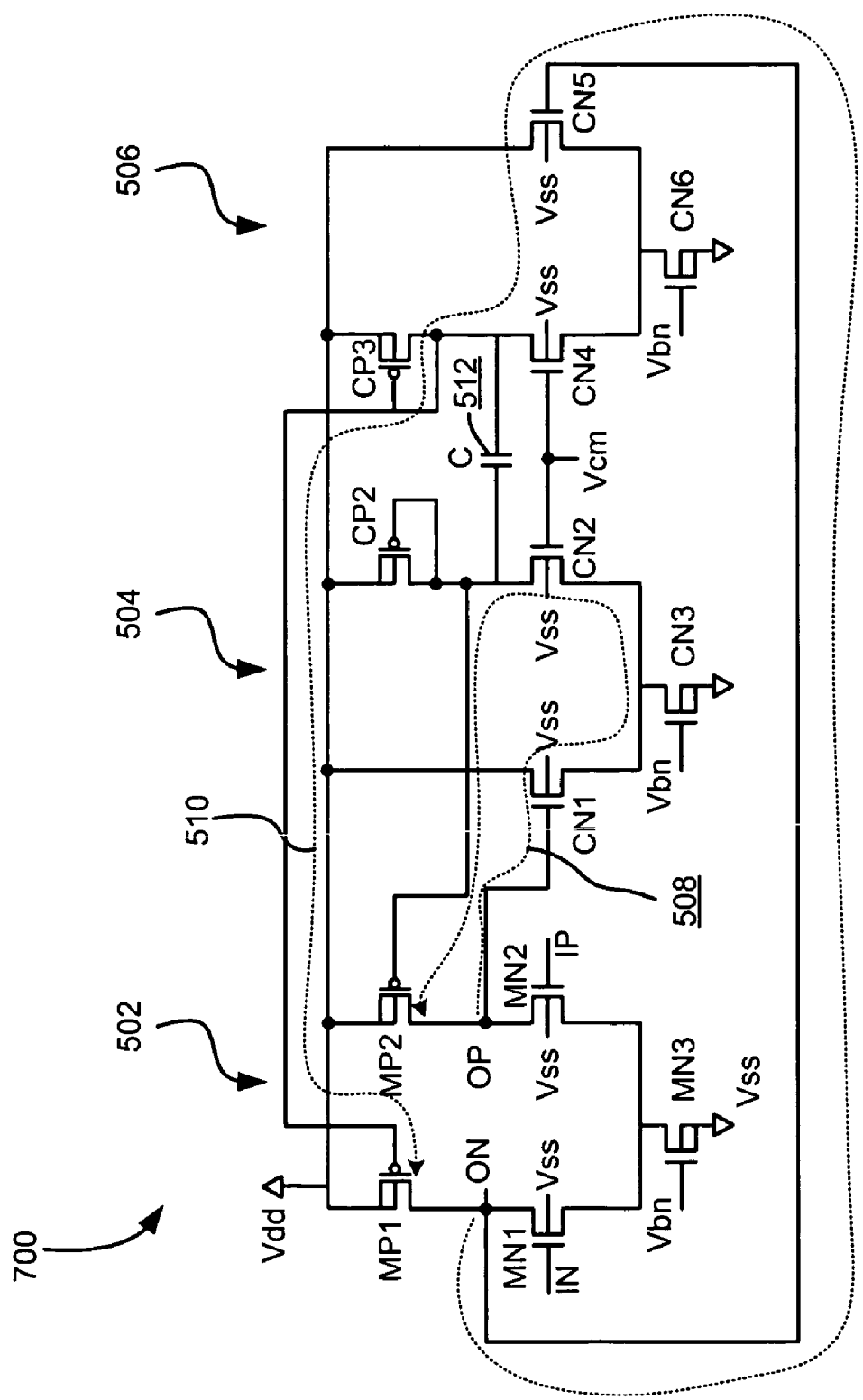
FIG. 9 is a circuit diagram of a fully differential amplifier circuit according to another embodiment of the present invention.

FIG. 9 illustrates another alternate embodiment 700, wherein the second and third sections 504, 506 have no CP1 and CP4.

Figure 10:
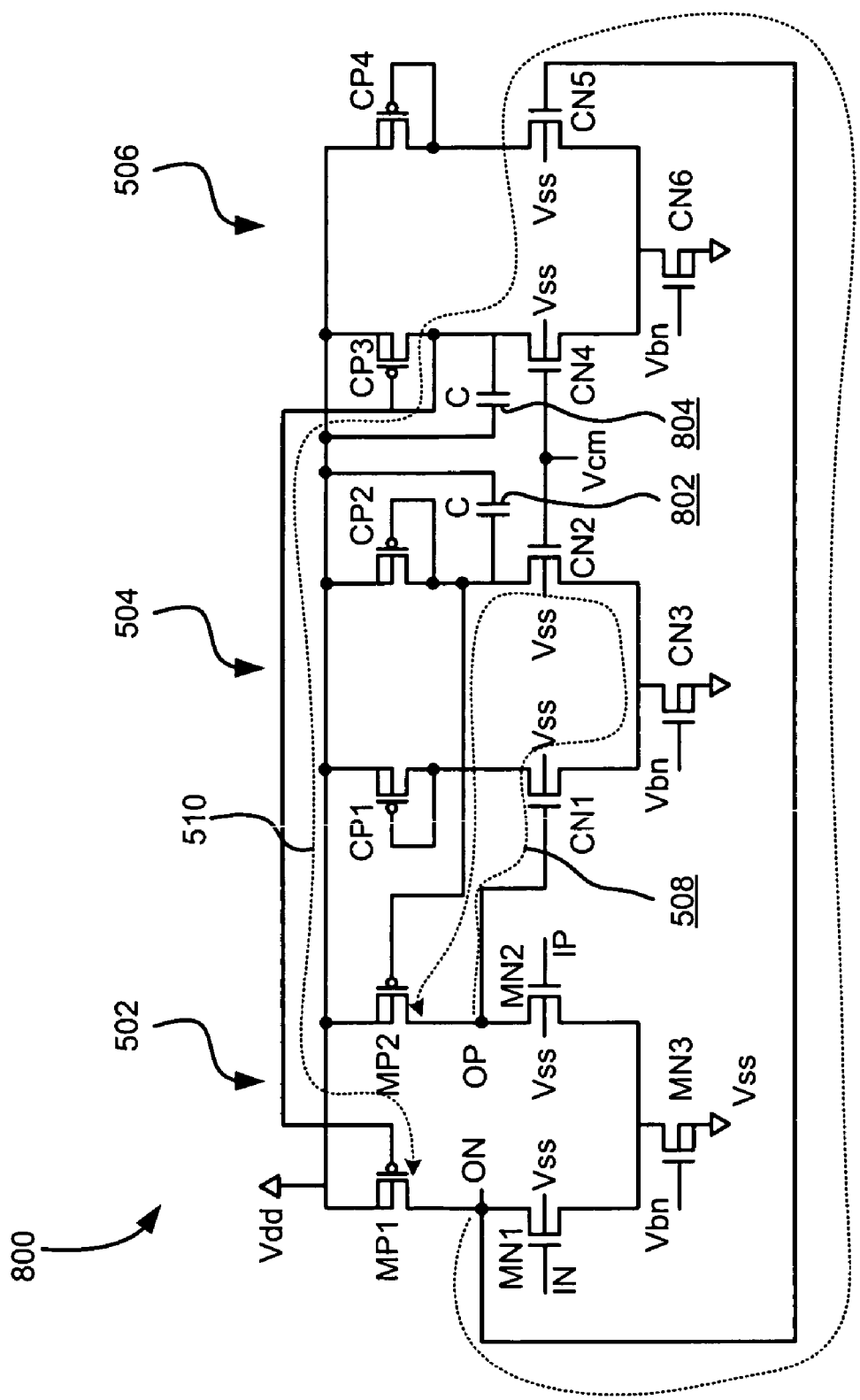
FIG. 10 is a circuit diagram of a fully differential amplifier circuit according to yet another embodiment of the present invention.

FIG. 10 illustrates an alternate embodiment 800, where the second and third sections 504, 506 each have an individual capacitor 802, 804 associated therewith. In this way, the first and second feedback loops 508, 510 are each coupled to an individual low pass filter created by the respective section and capacitor combination.

Also, in those embodiment 500, 600, 700, and 800, the first, second, and third secession implementing transistors could be their complimentary counterparts.

Again it is emphasized that the embodiments described herein have broad application to fields outside of RF and RFID technologies.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A fully differential amplifier circuit, comprising:
a first section for generating first and second output signals on first and second outputs from first and second input signals;
a first negative feedback loop coupled to the first section;
a second negative feedback loop coupled to the first section;
a second section for controlling the first negative feedback loop for adjusting the first output signal towards a common mode voltage level, and for reducing an offset voltage of the first output signal;
a third section for controlling the second negative feedback loop for adjusting the second output signal towards the common mode voltage level, and for reducing an offset voltage of the second output signal,
wherein the first section includes a first transistor being controlled by the first input signal and a second transistor being controlled by the third section via the second negative feedback loop; wherein the first section further includes a third transistor being controlled by the second input signal and a fourth transistor being controlled by the second section via the first negative feedback loop.

2. A circuit as recited in claim 1, wherein the first, second and third sections are differential cells.

3. A circuit as recited in claim 1, wherein the transistors operate in a subthreshold region thereof.

4. A circuit as recited in claim 1, wherein the second and third sections are coupled together via a capacitor.

5. A circuit as recited in claim 1, further comprising two substantially identical low pass filters coupled to the first and second negative feedback loops respectively, wherein signals passing through the first and second negative feedback loops reduce the offset voltages of the first and second output signals and set the common mode voltage of the first and second output signals.

6. A circuit as recited in claim 5, wherein the second and third sections in combination with a capacitor comprise the low pass filter for differential signals.

7. A circuit as recited in claim 5, wherein the low pass filter filters out substantially all signals from the feedback loops having about the same frequency as data portions of the input signals for differential outputs.

8. A circuit as recited in claim 1, further comprising a first low pass filter coupled to the first negative feedback loop and a second low pass filter coupled to the second negative feedback loop, wherein signals passing through the first and second negative feedback loops reduce the offset voltages of the first and second output signals.

9. A circuit as recited in claim 1, wherein the first negative feedback loop couples the first output to the second section, wherein the second negative feedback loop couples the second output to the third section.

10. A circuit as recited in claim 1, wherein a bandwidth of an offset reducing portion of a loop signal of each negative feedback loop is different than a bandwidth of a common mode adjusting portion of the loop signal of each negative feedback loop.

11. A Radio Frequency Identification (RFID) system, comprising:
a plurality of RFID tags each having a circuit as recited in claim 1; and
an RFID interrogator in communication with the RFID tags.

12. A fully differential amplifier circuit, comprising:
a first section for generating first and second output signals on first and second outputs from first and second input signals:
a first negative feedback loop coupling the first output to a low pass filter, the first negative feedback loop adjusting the first output towards a common mode voltage level, and reducing an offset voltage of the first output signal;
a second negative feedback loop coupling the second output to a low pass filter, the second negative feedback loop controlling the second negative feedback loop for adjusting the second output towards the common mode voltage level, and reducing an offset voltage of the second output signal,
wherein the low pass filter coupled to the first negative feedback loop includes a second differential cell coupled to a capacitor, wherein the low pass filter coupled to the second negative feedback loop includes a second differential cell coupled to a capacitor.

13. A fully differential amplifier circuit as recited in claim 12, wherein the differential cells are coupled to same capacitor.

14. A circuit comprising:
a first section for generating first and second output signals on first and second outputs from first and second input signals;
a first negative feedback loop coupling the first output to a low pass filter, the first negative feedback loop adjusting the first output towards a common mode voltage level, and reducing an offset voltage of the first output signal;
a second negative feedback loop coupling the second output to a low pass filter, the second negative feedback loop controlling the second negative feedback loop for adjusting the second output towards the common mode voltage level, and reducing an offset voltage of the second output signal,
wherein the first section includes a first transistor being controlled by the first input signal and a second transistor being controlled by the third section via the second negative feedback loop; wherein the first section further includes a third transistor being controlled by the second input signal and a fourth transistor being controlled by the second section via the first negative feedback loop.

15. A circuit as recited in claim 14, wherein the transistors operate in a subthreshold region thereof.

16. A circuit as recited in claim 12, wherein the low pass filter filters out substantially all differential signals from the negative feedback loops having about the same frequency as data portions of the input signals.

17. A circuit as recited in claim 12, wherein a bandwidth of an offset reducing portion of a loop signal of each negative feedback loop is different than a bandwidth of a common mode adjusting portion of the loop signal of each negative feedback loop.

18. A Radio Frequency Identification (RFID) system, comprising:
a plurality of RFID tags each having a circuit as recited in claim 12; and
an RFID interrogator in communication with the RFID tags.

19. A fully differential amplifier circuit, comprising:
a first differential cell for generating first and second output signals on first and second outputs from first and second input signals;
a first negative feedback loop coupled to the first output of the first differential cell;
a second negative feedback loop coupled to the second output of the first differential cell;
a second differential cell coupled to a capacitor thereby forming a low pass filter for differential signals, the second differential cell controlling the first negative feedback loop for adjusting the first output signal towards a common mode voltage level, and for reducing an offset voltage of the first output signal;
a third differential cell coupled to a capacitor thereby forming a low pass filter for differential signals, the third differential cell for controlling the second negative feedback loop for adjusting the second output signal towards the common mode voltage level, and for reducing an offset voltage of the second output signal,
wherein the first differential cell includes a first transistor being controlled by the first input signal and a second transistor being controlled by the third differential cell via the second negative feedback loop; wherein the first section further includes a third transistor being controlled by the second input signal and a fourth transistor being controlled by the second differential cell via the first negative feedback loop.

20. A circuit as recited in claim 19, wherein the transistors operate in a subthreshold region thereof.

21. A circuit as recited in claim 19, wherein the second and third differential cells are coupled together via the capacitor.

22. A circuit as recited in claim 19, wherein the low pass filter filters out substantially all differential signals from the negative feedback loops having about the same frequency as data portions of the input signals.

23. A circuit as recited in claim 19, wherein a bandwidth of an offset reducing portion of a loop signal of each negative feedback loop is different than a bandwidth of a common mode adjusting portion of the loop signal of each negative feedback loop.

24. A Radio Frequency Identification (RFID) system, comprising:
a plurality of RFID tags each having a circuit as recited in claim 19; and
an RFID interrogator in communication with the RFID tags.

* * * * *

UNITED STATES PATENT AND TRADEMARK OFFICE
CERTIFICATE OF CORRECTION

PATENT NO. : 7,683,717 B2 Page 1 of 1
APPLICATION NO. : 11/303897
DATED : March 23, 2010
INVENTOR(S) : Yang et al.

It is certified that error appears in the above-identified patent and that said Letters Patent is hereby corrected as shown below:

In Section Number (56) of the issued patent cover page:

Please add: "6,343,858 B1 2/2002 Forbes et al.............330/258", under the references cited.

Signed and Sealed this

Twenty-seventh Day of July, 2010

David J. Kappos
*Director of the United States Patent and Trademark Office*